(12) United States Patent
Gambino et al.

(10) Patent No.: US 9,337,078 B2
(45) Date of Patent: May 10, 2016

(54) HEAT DISSIPATION THROUGH DEVICE ISOLATION

(71) Applicant: International Business Machines Corporation, Armonk, NY (US)

(72) Inventors: Jeffrey P. Gambino, Westford, VT (US); Qizhi Liu, Lexington, MA (US); Zhenzhen Ye, South Burlington, VT (US); Yan Zhang, South Burlington, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 408 days.

(21) Appl. No.: 14/024,075

(22) Filed: Sep. 11, 2013

(65) Prior Publication Data

US 2015/0069571 A1    Mar. 12, 2015

(51) Int. Cl.
*H01L 21/762* (2006.01)
*H01L 23/367* (2006.01)

(52) U.S. Cl.
CPC ......... *H01L 21/76224* (2013.01); *H01L 23/367* (2013.01); *H01L 2924/0002* (2013.01)

(58) Field of Classification Search
USPC ................................... 257/506, 526, E21.546
IPC ....... H01L 23/367,23/3731, 29/0649, 21/76224
See application file for complete search history.

(56) References Cited

U.S. PATENT DOCUMENTS

| | | | |
|---|---|---|---|
| 6,051,871 A | 4/2000 | DeLaCruz et al. | |
| 7,067,406 B2* | 6/2006 | Liang | H01L 21/76224 |
| | | | 257/E21.546 |
| 7,223,992 B2 | 5/2007 | Liang et al. | |
| 2006/0051932 A1* | 3/2006 | Yoneda | H01L 21/76232 |
| | | | 438/424 |
| 2006/0097274 A1 | 5/2006 | Lee et al. | |
| 2007/0145596 A1 | 6/2007 | Chen et al. | |
| 2011/0059609 A1 | 3/2011 | Rhee et al. | |
| 2012/0025316 A1 | 2/2012 | Schultz | |
| 2012/0146098 A1* | 6/2012 | Dahlstrom | H01L 21/76224 |
| | | | 257/197 |
| 2012/0164799 A1 | 6/2012 | Kurz et al. | |
| 2012/0211792 A1 | 8/2012 | Wei et al. | |
| 2013/0020618 A1 | 1/2013 | Zhong et al. | |
| 2013/0161634 A1* | 6/2013 | Disney | H01L 29/0619 |
| | | | 257/76 |

OTHER PUBLICATIONS

Benoît Barbalat et al., "Deep Trench Isolation Effect on Self-Heating and RF Performances of SiGeC HBTs", 2005 IEEE. pp. 129-132.
David .J. Walkey et al., "Modeling thermal resistance in trench-isolated bipolar technologies including trench heat flow", Elsevier, 2002, pp. 7-17.
L. La Spina et al., "Aluminum Nitride for Heatspreading in RF IC's" pp. 1-5, Jul. 23, 2013.

(Continued)

*Primary Examiner* — Marcos D Pizarro
(74) *Attorney, Agent, or Firm* — Gibb & Riley, LLC; David A. Cain, Esq.

(57) ABSTRACT

According to a structure herein, a silicon substrate has an active device in the silicon substrate. A dielectric film is on the active device. An isolation trench is in the dielectric film surrounding the active device. The trench extends through the dielectric film and at least partially into the silicon substrate. A core is in the isolation trench. The core comprises material having thermal conductivity greater than silicon dioxide and electrical conductivity approximately equal to silicon dioxide.

7 Claims, 14 Drawing Sheets

(56) References Cited

OTHER PUBLICATIONS

L. La Spina et al., "Characterization of PVD Aluminum Nitride for Heat Spreading in FR IC's" pp. 354-357, IEEE, 2007.
R. Martinez, et. al., "Growth of AlN films by chemical vapor deposition", Superficies, vol. 9, pp. 82-84, Dec. 1999.
A. Rice, et. al., "Homoepitaxial Deposition AlN on (0001)-oriented AlN substrates by MOCVD ", NC State University, p. 1.
F. A. Khan, et. al., "High rate etching of AlN using BCl3/Cl2/Ar inductively coupled plasma", Materials Science and Engineering B95 (2002) pp. 51-54.
D. Chen, et. al., "Dry etching of AlN films using the plasma generated by fluoride", Vacuum, vol. 83 (2009), pp. 282-285.

\* cited by examiner

HEAT DISSIPATION THROUGH DEVICE ISOLATION

BACKGROUND

The present disclosure relates generally to integrated circuit device design, and more specifically, to device isolation structures having improved thermal conductivity.

Silicon Germanium (SiGe) Heterojunction bipolar devices have been widely used in high speed and high frequency applications. For a typical bipolar transistor, the collector junction that is located at the bottom of the sandwich layers has more current flow compared with the base in the center layer and the emitter in top layer. In advanced SiGe Heterojunction bipolar transistors (HBTs), as current density goes up, and devices are scaled down in geometry, thermal heating becomes severe. Trench isolation, using a mid-depth trench, is not adequate for transferring heat out. Typically, conventional oxide material is replaced with high thermal conductivity materials (e.g. poly-Si) over a thick liner for electrical isolation purpose. Although thermal conductivity can be improved therein, the thick liner (~300 Å) restricts the heat dissipation efficiency. Moreover, the filled material increases current leakage risk. With continually smaller geometric scaling and increased supplied power, the thermal effect becomes more and more significant. As such, conventional isolation structures including deep trench (DT) and trench isolation (TI) are inadequate for transferring sufficient heat away from the HBT. A more efficient heat dissipation method is desired.

SUMMARY

According to devices and methods herein, a heat dissipation method through trench isolation (TI) is disclosed. Generated heat from a bipolar transistor can be dissipated through TI. After a TI portion has been etched, a very thin oxidation layer (~5 Å) is formed inside the TI. Then the TI is filled with materials that have high thermal conductivity and electrical resistivity (e.g. Aluminum Nitride). The resulting device has improved heat dissipation efficiency (thin liner) and less leakage risk (high electrical resistivity of filled material) for SiGe bipolar devices. According to devices and methods herein, various TI structures can be used, such as TI fins and interconnector fins.

According to a structure herein, a silicon substrate has an active device in the silicon substrate. A dielectric film is on the active device. An isolation trench is in the dielectric film surrounding the active device. The trench extends through the dielectric film and at least partially into the silicon substrate. A core is in the isolation trench. The core comprises material having thermal conductivity greater than silicon dioxide and electrical conductivity approximately equal to silicon dioxide.

According to another structure herein, a silicon substrate has an active device in the silicon substrate. A dielectric film is on the active device. An isolation trench extends through the dielectric film and at least partially into the silicon substrate. The trench surrounds the active device. A core is in the isolation trench. The core comprises material having thermal conductivity greater than silicon dioxide and electrical conductivity approximately equal to silicon dioxide. Thermal isolation fins are connected to the material in the isolation trench and at least partially surround the active device.

According to a method herein, an active device is formed on a silicon substrate. A dielectric film is deposited over the active device. A trench is formed around the active device. The trench is formed through the dielectric film and at least partially into the silicon substrate. The trench is filled with a material having thermal conductivity greater than silicon dioxide and electrical conductivity approximately equal to silicon dioxide.

BRIEF DESCRIPTION OF THE DRAWINGS

The devices and methods herein will be better understood from the following detailed description with reference to the drawings, which are not necessarily drawn to scale and in which.

DETAILED DESCRIPTION

Figure 1:
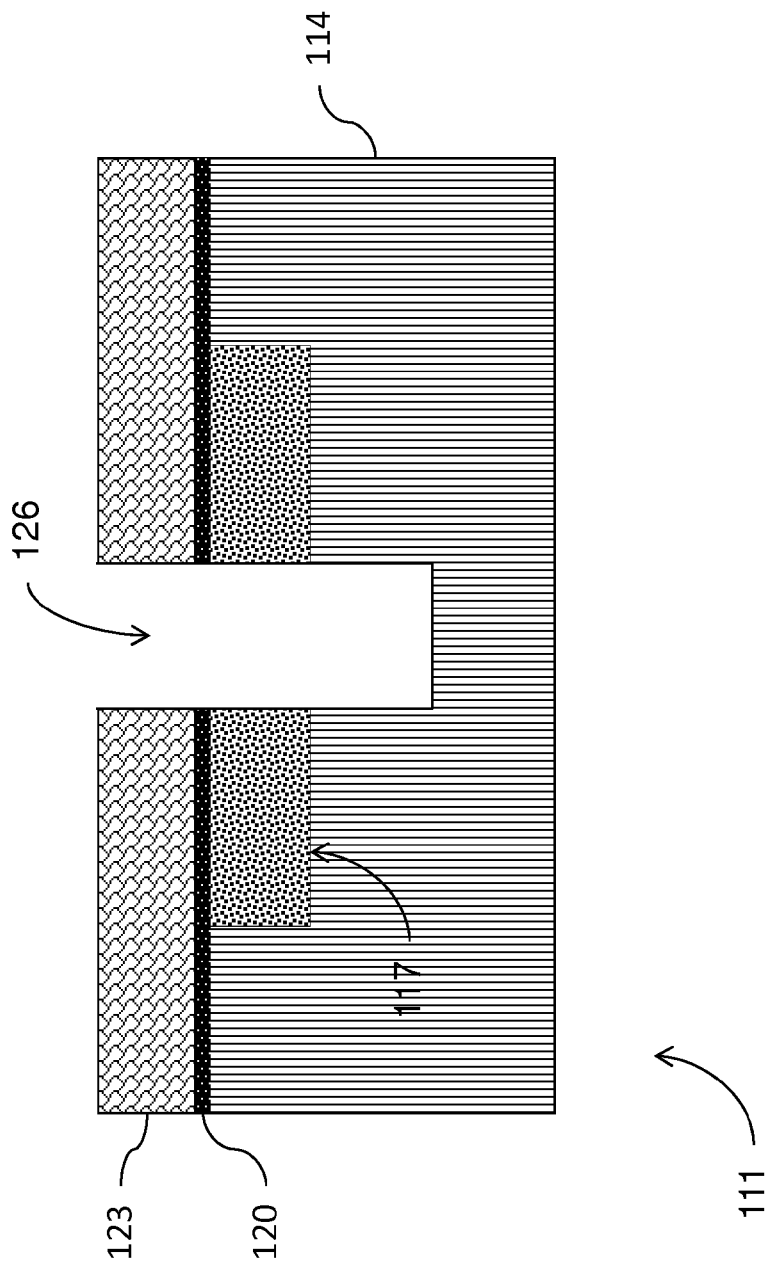
FIG. 1 is an elevational view of a semiconductor structure illustrating various aspects of devices and methods herein.

It will be readily understood that the devices and methods of the present disclosure, as generally described and illustrated in the drawings herein, may be arranged and designed in a wide variety of different configurations in addition to the devices and methods described herein. Thus, the following detailed description of the devices and methods, as represented in the drawings, is not intended to limit the scope defined by the appended claims, but is merely representative of selected devices and methods. The following description is intended only by way of example, and simply illustrates certain concepts of the devices and methods, as disclosed and claimed herein.

Referring to the drawings, FIG. 1 shows a portion of a semiconductor wafer, indicated generally as 111. The wafer 111 comprises a substrate 114 with a shallow trench isolation (STI) 117 formed in the substrate 114. The substrate 114 may comprise any conventional semiconductor substrate such as, for example, a bulk silicon substrate or an active layer of semiconductor material of a silicon-on-insulator (SOI) wafer. The STI 117 may be a conventional shallow trench isolation structure formed using conventional semiconductor fabrication processes and materials. For example, the STI 117 may be formed by forming a photoresist material on the substrate 114, exposing and developing the photoresist, etching an STI trench in the substrate through the patterned photoresist, stripping the photoresist, filling the trench with an STI material (e.g., SiO$_2$), and planarizing the top surface of the structure (e.g., via chemical mechanical polish (CMP)).

The wafer 111 may include a barrier layer 120 formed over the STI 117. The barrier layer 120 may comprise any suitable barrier layer material, such as, for example, nitride, oxynitride, etc. The barrier layer 120 may also cover portions of the substrate 114 and devices (e.g., transistors, etc.) formed in the substrate 114.

Additionally, the wafer 111 may comprise an insulator layer 123. The insulator layer 123 may comprise any suitable insulator material, such as silicon dioxide (SiO$_2$), borophosphosilicate glass (BPSG), etc. According to devices and methods herein, the insulator layer 123 may comprise an interlevel dielectric (ILD) layer of BPSG in which contacts are formed to provide electrical connection to one or more devices (e.g., transistors, resistors, capacitors, etc.) formed in and/or on the substrate 114.

FIG. 1 also shows a trench 126 extended into the substrate 114. As depicted in FIG. 1, the trench 126 is formed through the insulator layer 123, barrier layer 120, and STI 117. According to devices and methods herein, the trench 126 may be formed by etching the insulator layer 123, barrier layer 120, and STI 117 using an appropriate photoresist (not shown), as would be known by one skilled in the relevant art. One or more conventional etch processes, such as a reactive ion etch (RIE), may be used to form the trench 126. For example, a respective RIE process may be performed for etching each of the insulator layer 123, barrier layer 120, and STI 117, with each respective RIE process being tailored to the material of the feature being etched.

Any suitable etch may be used to form the trench 126 in the substrate 114, such as a selective RIE process. In one non-limiting example, the trench 126 may have a width of about 0.5 µm to about 1.5 µm and a depth of about 2 µm to about 6.0 µm from a top of the insulator layer 123 to a base of the trench 126 in the substrate 114. It is contemplated that the present disclosure is not limited to these exemplary dimensions, however, and any suitable width and depth may be used with the trench 126 as appropriate.

Figure 2:
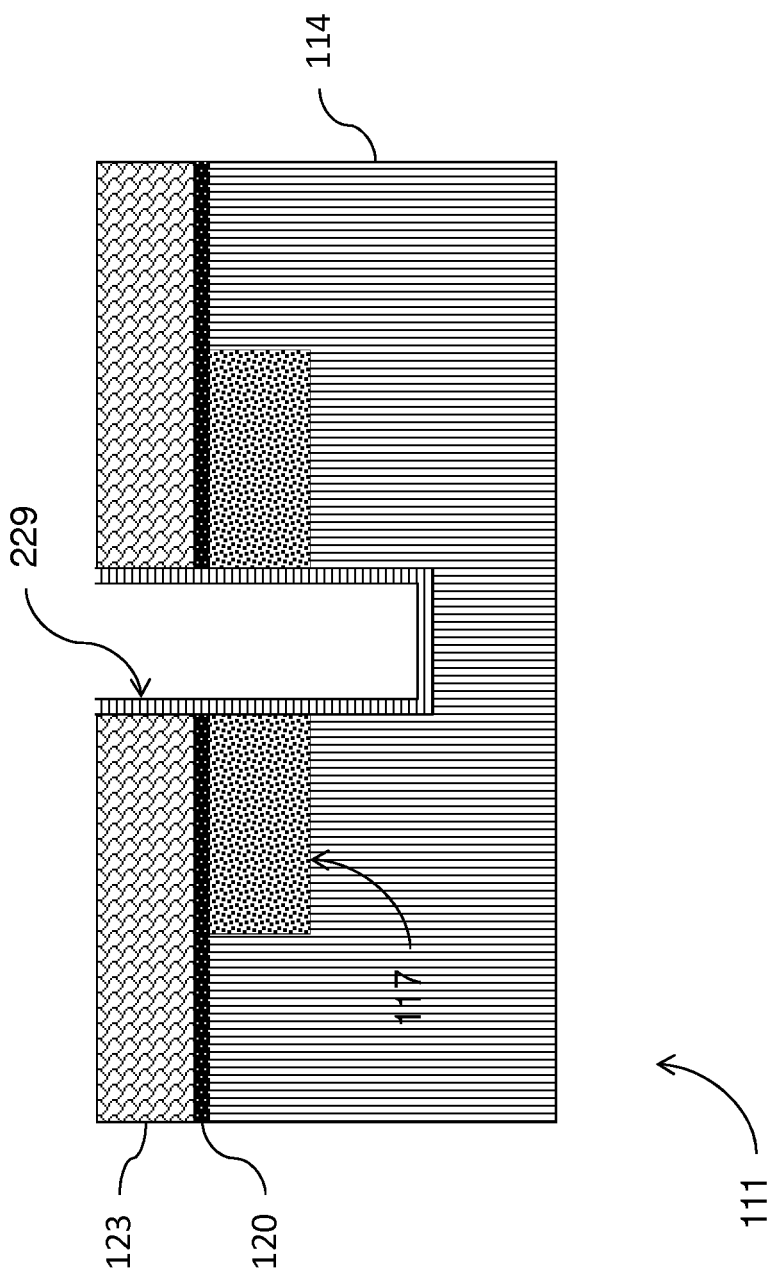
FIG. 2 is an elevational view of a semiconductor structure illustrating various aspects of devices and methods herein.

Referring to FIG. 2, a liner 229 comprising an electrical insulator material may be formed on the exposed surfaces of the trench 126, including the sidewalls and bottom. The liner 229 may be formed using conventional semiconductor processes and any suitable insulator material. For example, the liner 229 may be formed using a conformal deposition process, such as chemical vapor deposition (CVD). In some non-limiting examples, the liner 229 may be composed of the same material as the insulator layer 123, e.g., BPSG. According to devices and methods herein, the liner 229 is optional and may be thinly formed. For example, the liner 229 may have a thickness of only about 5 Å, although other thicknesses may be used.

Figure 3:
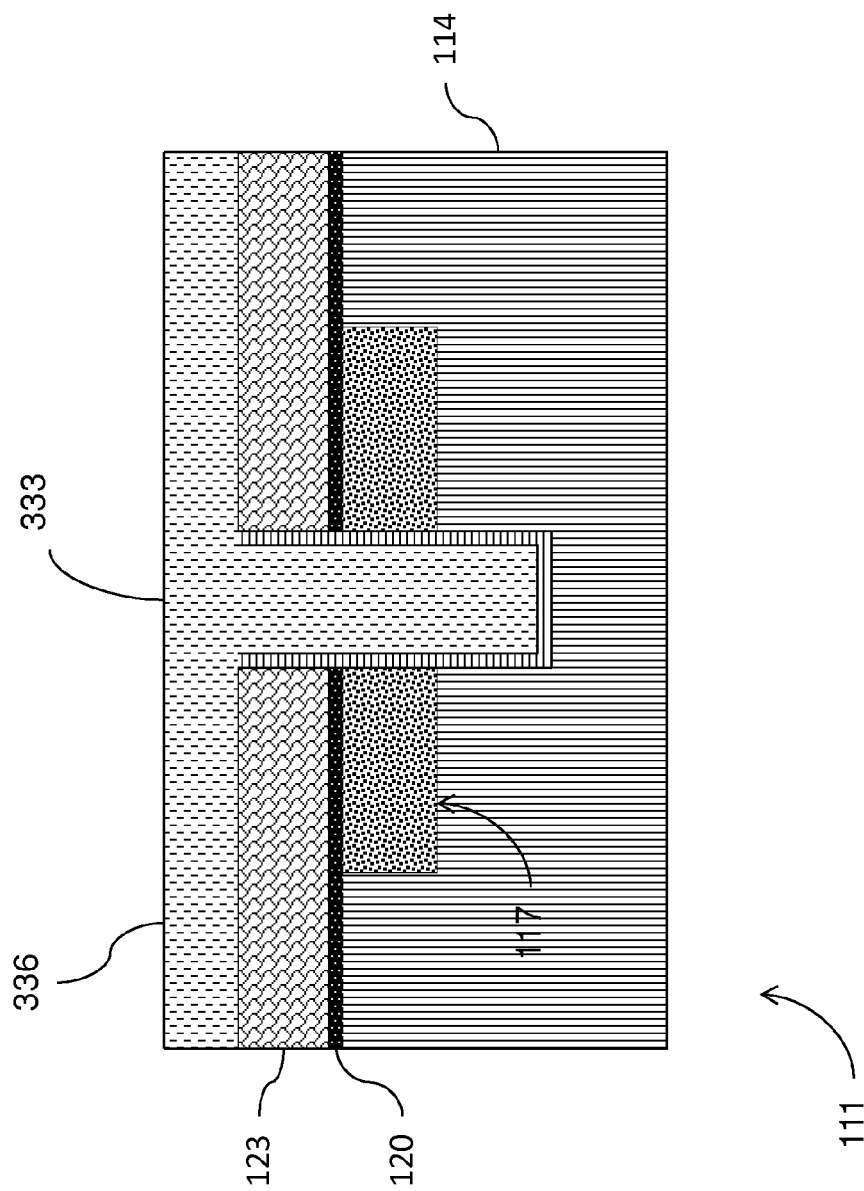
FIG. 3 is an elevational view of a semiconductor structure illustrating various aspects of devices and methods herein.

As depicted in FIG. 3, a core 333 is formed in the trench 126 on the liner 229 (if any). According to devices and methods herein, the core 333 comprises a material having high thermal conductivity and low electrical conductivity. In particular, according to devices and methods herein, the core material may have thermal conductivity greater than silicon dioxide and electrical conductivity approximately equal to silicon dioxide. Table 1 below lists various materials with their respective electrical conductivity and thermal conductivity.

| Materials | Electrical Conductivity $(\Omega \cdot m)^{-1}$ | Thermal Conductivity (W/m/K) |
| --- | --- | --- |
| Si | ~$10^{-3}$ | ~149 |
| SiO$_2$ | ~$10^{-18}$ | ~1.38 |
| Sapphire | ~$10^{-16}$ | ~41.9 |
| Aluminum Nitride (AlN) | ~$10^{-14}$ | ~285 |
| Beryllium Oxide (BeO) | ~$10^{-15}$ | ~330 |
| Alumina | ~$10^{-14}$ | ~40 |

As is evident from Table 1, aluminum nitride (AlN) and beryllium oxide (BeO) each has an electrical conductivity comparable to silicon dioxide (SiO$_2$) and a thermal conductivity two times larger than silicon (Si) alone, and substantially greater than that of SiO$_2$. Other appropriate materials or material combinations may be used.

The core 333 may be formed using a CVD process, although other high thermal conductivity materials may be provided using other formation processes. More specifically, according to devices and methods herein, the core 333 is composed of any suitable material that has a thermal conductivity greater than silicon dioxide and electrical conductivity approximately equal to silicon dioxide. For example, if aluminum nitride (AlN) is used, a thin layer of AlN may be achieved by homoepitaxil deposition of AlN by metalorganic chemical vapor deposition (MOCVD). Aluminum nitride is a good candidate material due to its good dielectric properties and high thermal conductivity, as well as its low thermal expansion coefficient, which is close to that of Si. Moreover, AlN is non-reactive with the chemicals used in the semiconductor formation process.

Figure 4:
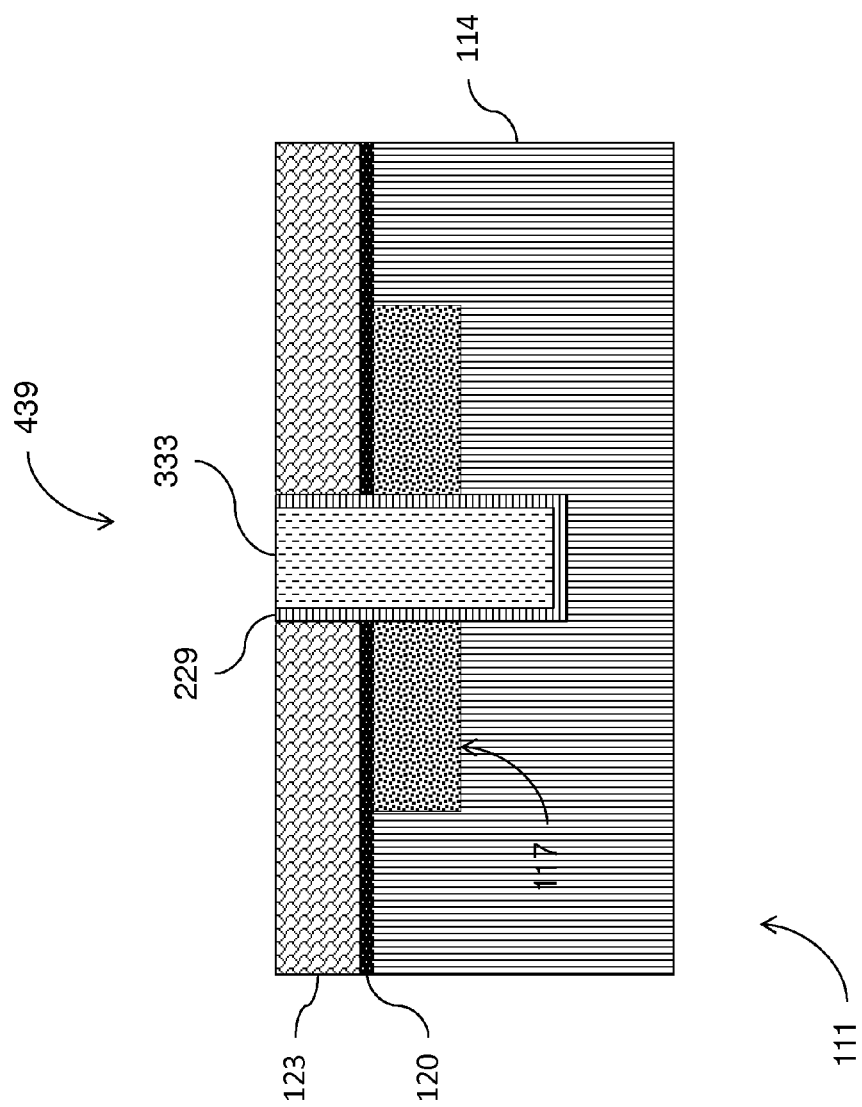
FIG. 4 is an elevational view of a semiconductor structure illustrating various aspects of devices and methods herein.

The deposition of the core 333 may result in the formation of excess material 336 on the upper surface of the insulator layer 123. As shown in FIG. 4, the excess material may be removed using a planarization process. Any suitable planarization process may be used, such as an etch or CMP process. In particular, the structure may be planarized using an endpoint etch that removes the excess material 336 from the top surface of the insulator layer 123. The planarization stops at the top of the insulator layer 123. In the example using aluminum nitride (AlN), inductively-coupled-plasma reactive ion etching of AlN was investigated using BCl$_3$/Cl$_2$/Ar gas chemistry. AlN films can also be etched by RIE using fluorine-based chemistries. After this step, conventional processing can be used to form contacts and interconnects.

According to devices and methods herein, the liner 229 and core 333 constitute a trench isolation (TI) 439. The TI 439 provides electrical isolation and enhanced thermal dissipation due to the core 333 composed of material having high thermal conductivity and low electrical conductivity.

Figure 5:
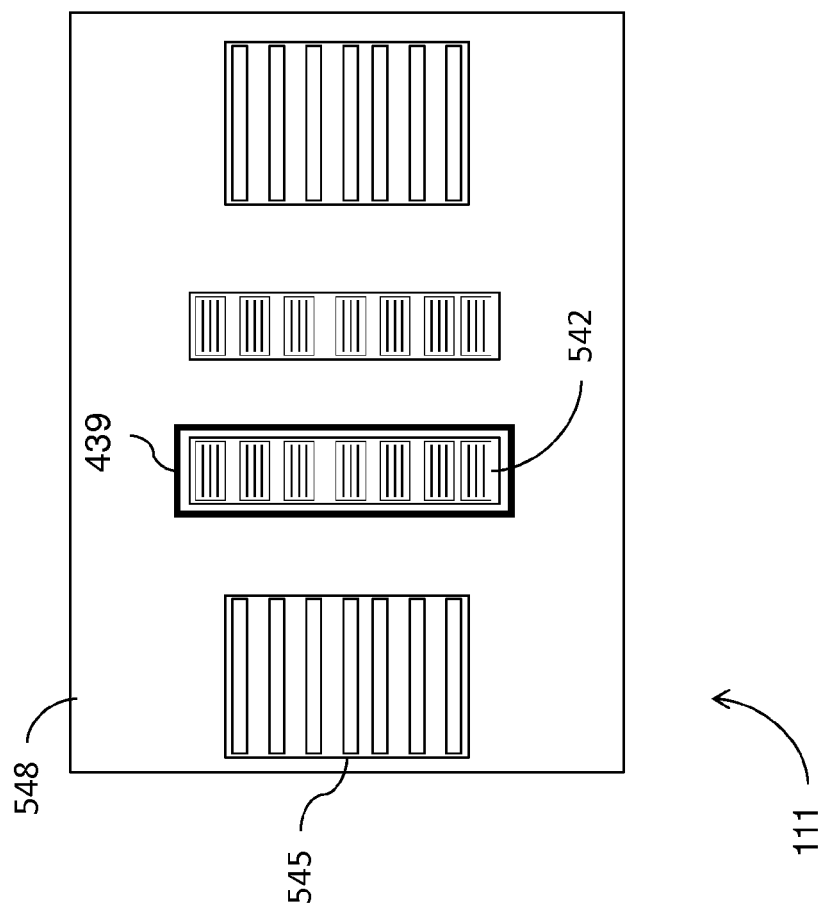
FIG. 5 is a top view of a semiconductor structure illustrating various aspects of devices and methods herein.

FIG. 5 shows a top view of a portion of the semiconductor wafer 111. The wafer 111 includes one or more active devices 542. The wafer 111 may also include through silicon vias (TSV) 545. According to devices and methods herein, the active device 542 may comprise a PNP or NPN transistor array. (Note: lines and connectors are not shown in the top view in order to avoid clutter.) The active device 542 may comprise one or a number of HBTs connected to other devices in an integrated circuit (IC) chip, e.g., on a BiCMOS IC chip. In particular, the active device 542 may be any suitable HBT, such as a self-aligned SiGe HBT. As shown in FIG. 5, the TI 439 may surround the active device(s) 542. According to devices and methods herein, the active device(s) 542 may comprise any device or portion of an integrated circuit structure having a need for heat dissipation, such as a field effect transistor (FET), a combination of transistors (e.g.

a bipolar transistor and a FET transistor), or a silicon rectifier. Other devices and/or circuit components may be used.

An insulator layer 548 may cover the substrate 114, TI 439, and the active device(s) 542. The insulator layer 548 may be the same as insulator layer 123 described above with respect to FIG. 1 and may be composed of, for example, BPSG deposited using CVD. The structure shown in FIG. 5 may be formed using conventional semiconductor fabrication processes and materials.

The TI 439 provides electrical isolation for the active device 542 due to the low electrical conductivity properties of the material of the core 333 formed adjacent to and on plural sides of the active device 542. The TI 439 also provides enhanced heat dissipation for the active device 542 due to the core 333 composed of high thermal conductivity material that has a relatively low thermal resistance.

Figure 6:
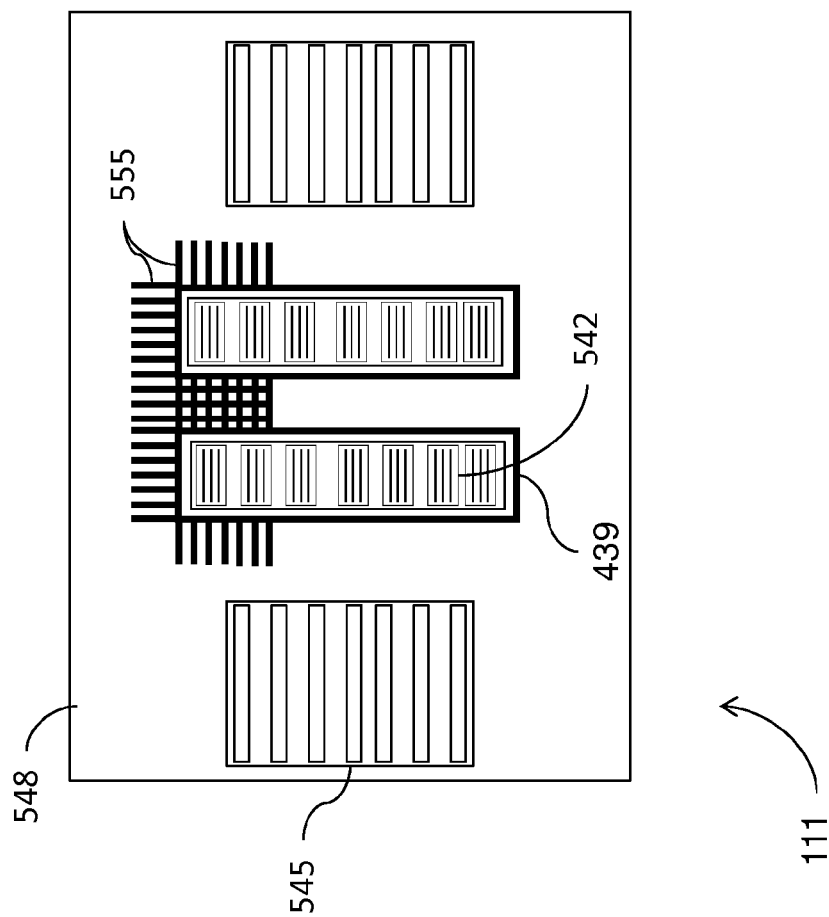
FIG. 6 is a top view of a semiconductor structure illustrating various aspects of devices and methods herein.

To maximize thermal dissipation efficiency, fins can be added to the TI 439. Referring to FIG. 6, one of more fins 555 may be connected to the core 333. According to devices and methods herein, the fins 555 may at least partially surround the active device 542. The fins 555 may comprise the same material as the core 333. Other appropriate material having high thermal conductivity may be used.

Figure 7:
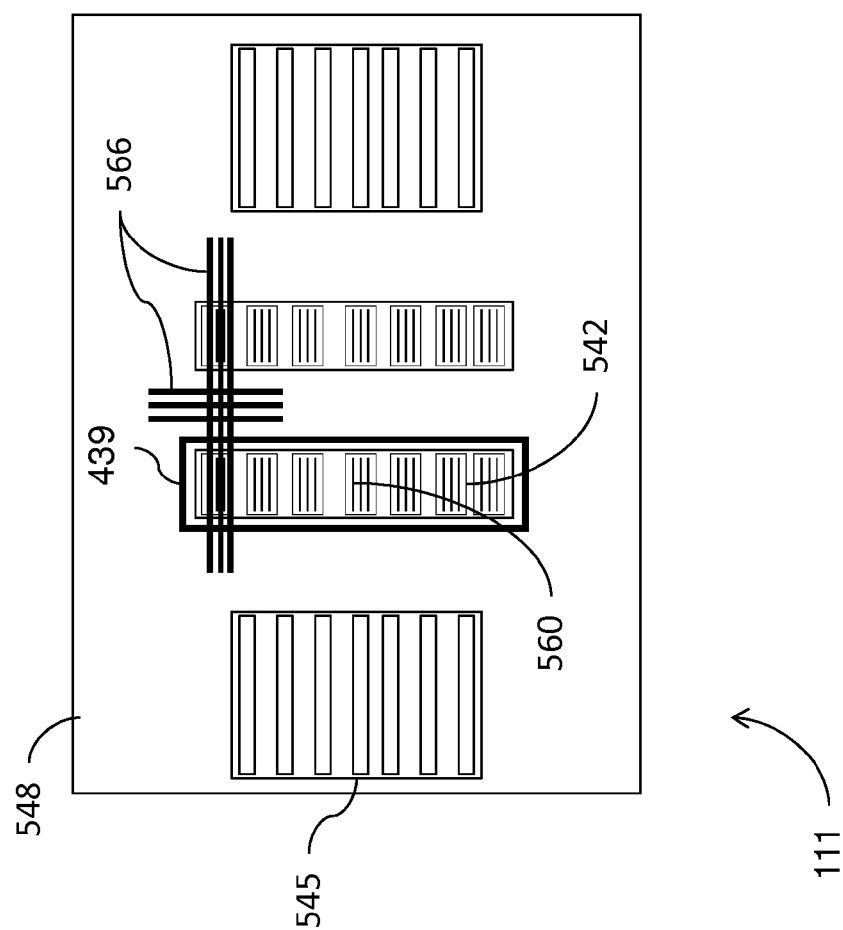
FIG. 7 is a top view of a semiconductor structure illustrating various aspects of devices and methods herein.

As depicted in FIG. 7, contacts 560 may be formed in the insulator layer 123 to provide electrical connections to the active device 542. The contacts 560 may be formed in any desired manner, such as masking the insulator layer 123, etching trenches in the insulator layer 123, and filling the trenches with an electrically conductive material (e.g., tungsten, etc.). According to devices and methods herein, inter-contact fins 566 may be formed over the active device 542. The inter-contact fins 566 may be at least partially attached to the contacts 560. The inter-contact fins 566 provide a low thermal resistance heat flow path upward from the active device 542 (e.g., to additional layers of the chip), in addition to the downward heat flow path provided by the core 333 (e.g., into the substrate 114). The inter-contact fins 566 may comprise the same material as the core 333. Other appropriate material having high thermal conductivity may be used.

Figure 8:
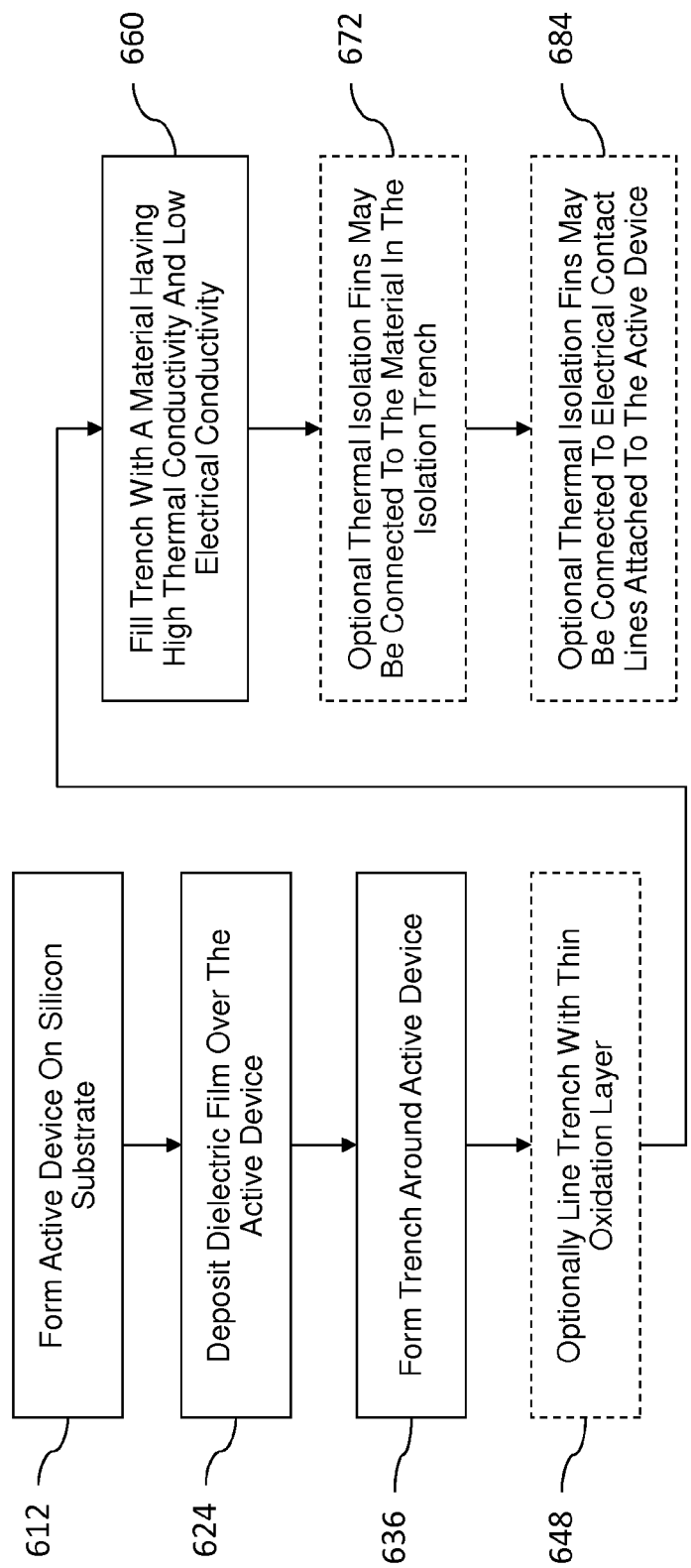
FIG. 8 is a flow diagram illustrating devices and methods herein.

FIG. 8 is a flow diagram illustrating the processing flow of an exemplary method of fabricating a Heterojunction bipolar transistor (HBT) using heat dissipation through device isolation according to devices and methods herein. At 612, an active device is formed on a silicon substrate. A dielectric film is deposited over the active device, at 624. A trench is formed around the active device, at 636. The trench is formed through the dielectric film and at least partially into the silicon substrate. At 648, optionally, a very thin oxidation layer (~5 Å) may be formed as a liner in the trench. The trench is then filled with a material having thermal conductivity greater than silicon dioxide and electrical conductivity approximately equal to silicon dioxide, at 660. At 672, optional thermal isolation fins may be connected to the material in the isolation trench and at least partially surrounding the active device. At 684, optional thermal isolation fins may be connected to electrical contact lines attached to the active device.

It is contemplated that the methods described herein can be used in fabricating a Silicon Germanium (SiGe) Heterojunction bipolar device, a Bipolar Complementary Metal Oxide Semiconductor (BiCMOS) device, or any Complementary Metal Oxide Semiconductor (CMOS) device.

The method as described above may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

For electronic applications, semiconducting substrates, such as silicon wafers, can be used. The substrate enables easy handling of the micro device through the many fabrication steps. Often, many individual devices are made together on one substrate and then singulated into separated devices toward the end of fabrication. In order to fabricate a microdevice, many processes are performed, one after the other, many times repeatedly. These processes typically include depositing a film, patterning the film with the desired micro features, and removing (or etching) portions of the film. For example, in memory chip fabrication, there may be several lithography steps, oxidation steps, etching steps, doping steps, and many others are performed. The complexity of microfabrication processes can be described by their mask count.

A device according to devices and methods herein may include a silicon substrate having an active device in the silicon substrate. A dielectric film is on the active device. An isolation trench surrounding the active device extends through the dielectric film and at least partially into the silicon substrate. A material is in the isolation trench. The material has thermal conductivity greater than silicon dioxide and electrical conductivity approximately equal to silicon dioxide. In some cases, thermal isolation fins may be connected to the material in the isolation trench and at least partially surrounding the active device. In some cases, thermal isolation fins may be connected to electrical contact lines attached to the active device.

Aspects of the present disclosure are described herein with reference to flowchart illustrations and/or block diagrams of methods, apparatus (systems), and computer program products according to various devices and methods. It will be understood that each block of the flowchart illustrations and/or two-dimensional block diagrams, and combinations of blocks in the flowchart illustrations and/or block diagrams, can be implemented by computer program instructions. The computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

According to a further devices and methods herein, an article of manufacture is provided that includes a tangible computer readable medium having computer readable instructions embodied therein for performing the steps of the computer implemented methods, including, but not limited to, the method illustrated in FIG. 8. Any combination of one or more computer readable non-transitory medium(s) may be utilized. The computer readable medium may be a computer readable signal medium or a computer readable storage medium. The non-transitory computer storage medium stores instructions, and a processor executes the instructions to perform the methods described herein. A computer readable storage medium may be, for example, but not limited to, an electronic, magnetic, optical, electromagnetic, infrared, or semiconductor system, apparatus, or device, or any suitable combination of the foregoing. Any of these devices may have computer readable instructions for carrying out the steps of the methods described above with reference to FIG. 8.

The computer program instructions may be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

Furthermore, the computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

In case of implementing the devices and methods herein by software and/or firmware, a program constituting the software may be installed into a computer with dedicated hardware, from a storage medium or a network, and the computer is capable of performing various functions if with various programs installed therein.

Figure 9:
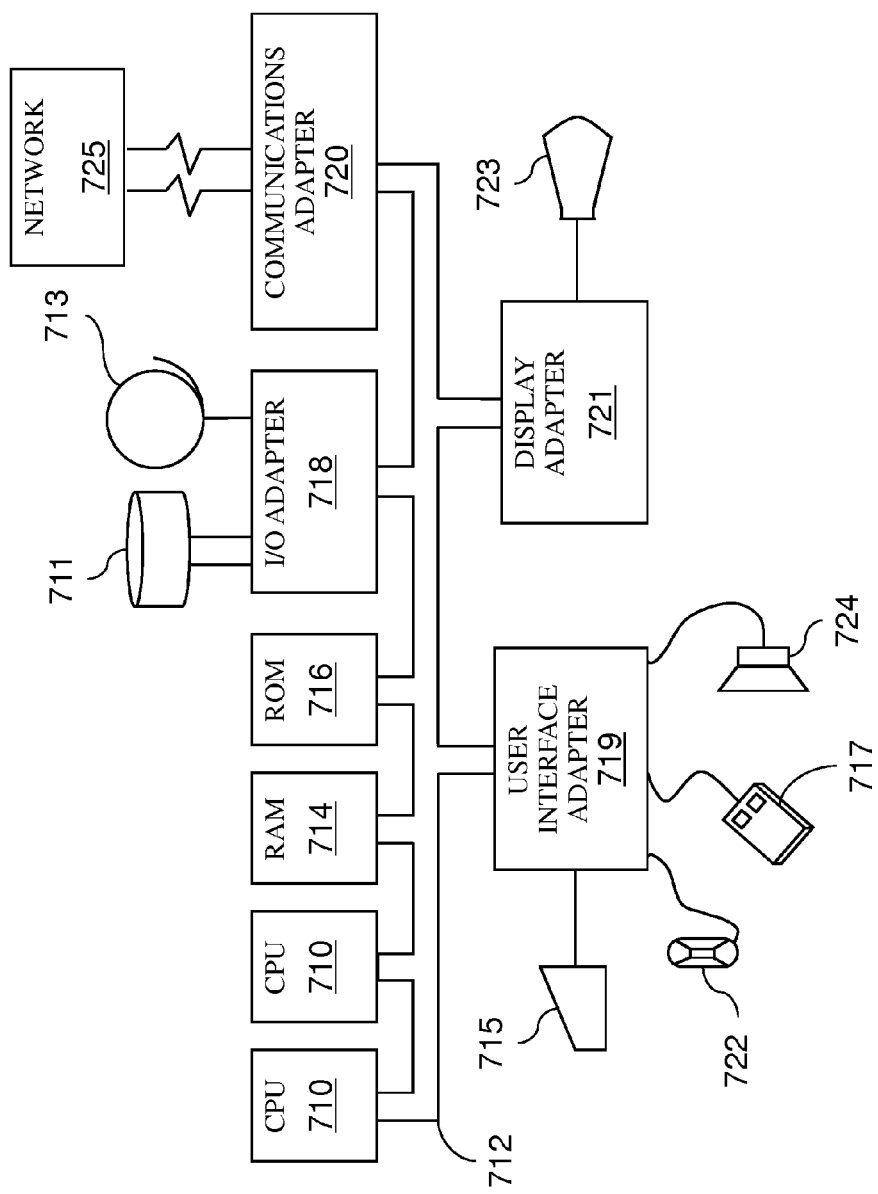
FIG. 9 is a schematic diagram of a hardware system according to devices and methods herein.

A representative hardware environment for practicing the devices and methods herein is depicted in FIG. 9. This schematic drawing illustrates a hardware configuration of an information handling/computer system in accordance with the devices and methods herein. The system comprises at least one processor or central processing unit (CPU) 710. The CPUs 710 are interconnected via system bus 712 to various devices such as a Random Access Memory (RAM) 714, Read-Only Memory (ROM) 716, and an Input/Output (I/O) adapter 718. The I/O adapter 718 can connect to peripheral devices, such as disk units 711 and tape drives 713, or other program storage devices that are readable by the system. The system can read the inventive instructions on the program storage devices and follow these instructions to execute the methodology of the devices and methods herein.

In FIG. 9, CPUs 710 perform various processing based on a program stored in a Read Only Memory (ROM) 716 or a program loaded from a peripheral device, such as disk units 711 and tape drives 713 to a Random Access Memory (RAM) 714. In the RAM 714, required data when the CPUs 710 perform the various processing or the like is also stored, as necessary. The CPUs 710, the ROM 716, and the RAM 714 are connected to one another via a bus 712. An I/O adapter 718 is also connected to the bus 712 to provide an input/output interface, as necessary. A removable medium, such as a magnetic disk, an optical disk, a magneto-optical disk, a semiconductor memory, or the like, is installed on the peripheral device, as necessary, so that a computer program read therefrom may be installed into the RAM 714, as necessary.

The system further includes a user interface adapter 719 that connects a keyboard 715, mouse 717, speaker 724, microphone 722, and/or other user interface devices such as a touch screen device (not shown) to the bus 712 to gather user input. Additionally, a communication adapter 720 including a network interface card such as a LAN card, a modem, or the like connects the bus 712 to a data processing network 725. The communication adapter 720 performs communication processing via a network such as the Internet. A display adapter 721 connects the bus 712 to a display device 723, which may be embodied as an output device such as a monitor (such as a Cathode Ray Tube (CRT), a Liquid Crystal Display (LCD), or the like), printer, or transmitter, for example.

In the case where the above-described series of processing is implemented with software, the program that constitutes the software may be installed from a network such as the Internet or a storage medium such as the removable medium.

Those skilled in the art would appreciate that the storage medium is not limited to the peripheral device having the program stored therein as illustrated in FIG. 9, which is distributed separately from the device for providing the program to the user. Examples of a removable medium include a magnetic disk (including a floppy disk), an optical disk (including a Compact Disk-Read Only Memory (CD-ROM) and a Digital Versatile Disk (DVD)), a magneto-optical disk (including a Mini-Disk (MD) (registered trademark)), and a semiconductor memory. Alternatively, the storage medium may be the ROM 716, a hard disk contained in the storage section of the disk units 711, or the like, which has the program stored therein and is distributed to the user together with the device that contains them.

As will be appreciated by one skilled in the art, aspects of the devices and methods herein may be embodied as a system, method, or computer program product. Accordingly, aspects of the present disclosure may take the form of an entirely hardware system, an entirely software system (including firmware, resident software, micro-code, etc.) or an system combining software and hardware aspects that may all generally be referred to herein as a "circuit," "module", or "system." Furthermore, aspects of the present disclosure may take the form of a computer program product embodied in one or more computer readable medium(s) having computer readable program code embodied thereon.

Any combination of one or more computer readable non-transitory medium(s) may be utilized. The computer readable medium may be a computer readable signal medium or a computer readable storage medium. The non-transitory computer storage medium stores instructions, and a processor executes the instructions to perform the methods described herein. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium include the following: an electrical connection having one or more wires, a portable computer diskette, a hard disk, a random access memory (RAM), a Read-Only Memory (ROM), an Erasable Programmable Read-Only Memory (EPROM or Flash memory), an optical fiber, a magnetic storage device, a portable compact disc Read-Only Memory (CD-ROM), an optical storage device, a "plug-and-play" memory device, like a USB flash drive, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including, but not limited to, wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++, or the like and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The flowchart and block diagrams in the Figures illustrate the architecture, functionality, and operation of possible implementations of systems, methods, and computer program products according to various devices and methods herein. In this regard, each block in the flowchart or block diagrams may represent a module, segment, or portion of code, which comprises one or more executable instructions for implementing the specified logical function(s). It should also be noted that, in some alternative implementations, the functions noted in the block might occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Deployment types include loading directly in the client, server, and proxy computers via loading a storage medium such as a CD, DVD, etc. The process software may also be automatically or semi-automatically deployed into a computer system by sending the process software to a central server or a group of central servers. The process software is then downloaded into the client computers that will execute the process software. The process software is sent directly to the client system via e-mail. The process software is then either detached to a directory or loaded into a directory by a button on the e-mail that executes a program that detaches the process software into a directory. Alternatively, the process software is sent directly to a directory on the client computer hard drive. When there are proxy servers, the process will select the proxy server code, determine on which computers to place the proxy servers' code, transmit the proxy server code, and then install the proxy server code on the proxy computer. The process software will be transmitted to the proxy server, and then stored on the proxy server.

While it is understood that the process software may be deployed by manually loading directly in the client, server, and proxy computers via loading a storage medium such as a CD, DVD, etc., the process software may also be automatically or semi-automatically deployed into a computer system by sending the process software to a central server or a group of central servers. The process software is then downloaded into the client computers that will execute the process software. Alternatively, the process software is sent directly to the client system via e-mail. The process software is then either detached to a directory or loaded into a directory by a button on the e-mail that executes a program that detaches the process software into a directory. Another alternative is to send the process software directly to a directory on the client computer hard drive. When there are proxy servers, the process will select the proxy server code, determine on which computers to place the proxy servers' code, transmit the proxy server code, and then install the proxy server code on the proxy computer. The process software will be transmitted to the proxy server, and then stored on the proxy server.

Figure 10:
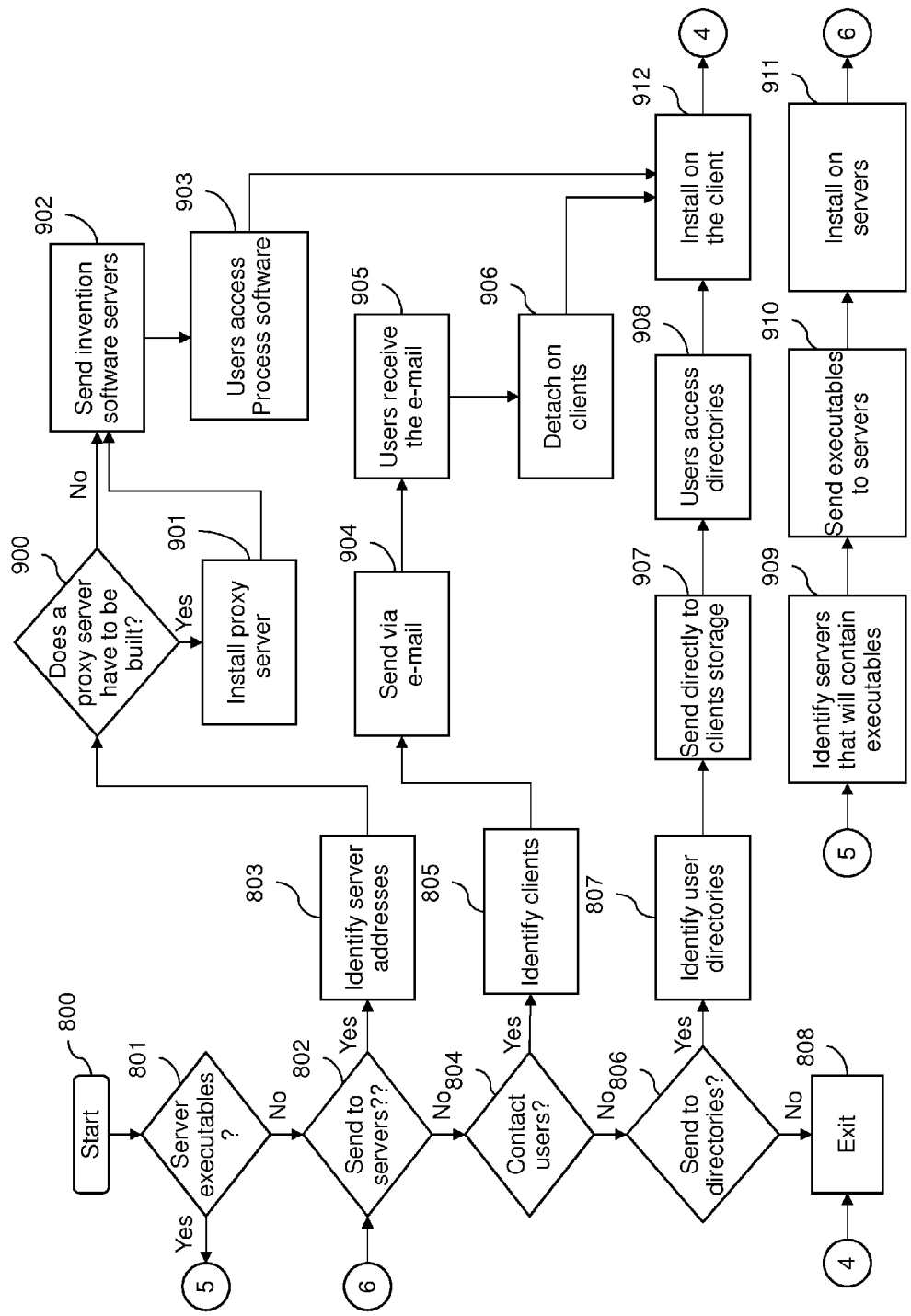
FIG. 10 is a schematic diagram of a deployment system according to devices and methods herein.

In FIG. 10, step 800 begins the deployment of the process software. The first thing is to determine if there are any programs that will reside on a server or servers when the process software is executed 801. If this is the case, then the servers that will contain the executables are identified 909. The process software for the server or servers is transferred directly to the servers' storage via FTP or some other protocol, or by copying through the use of a shared file system 910. The process software is then installed on the servers 911.

Next, a determination is made on whether the process software is to be deployed by having users access the process software on a server or servers 802. If the users are to access the process software on servers, then the server addresses that will store the process software are identified 803.

A determination is made if a proxy server is to be built 900 to store the process software. A proxy server is a server that sits between a client application, such as a Web browser, and a real server. It intercepts all requests to the real server to see if it can fulfill the requests itself. If not, it forwards the request to the real server. The two primary benefits of a proxy server are to improve performance and to filter requests. If a proxy server is required, then the proxy server is installed 901. The process software is either sent to the servers via a protocol such as FTP or it is copied directly from the source files to the server files via file sharing 902. Another method would be to send a transaction to the servers that contain the process software and have the server process the transaction, then receive and copy the process software to the server's file system. Once the process software is stored at the servers, the users, via their client computers, then access the process software on the servers and copy it to their client computers' file systems 903. Another method is to have the servers automatically copy the process software to each client and then run the installation program for the process software at each client computer. The users execute the program that installs the process software on their client computer 912, and then exit the process 808.

In step 804, a determination is made whether the process software is to be deployed by sending the process software to users via e-mail. The set of users where the process software will be deployed are identified together with the addresses of the user client computers 805. The process software is sent via e-mail 904 to each of the users' client computers. The users receive the e-mail 905 and then detach the process software from the e-mail to a directory on their client computers 906. The users execute the program that installs the process software on their client computer 912, and then exit the process 808.

Lastly, a determination is made on whether the process software will be sent directly to user directories on their client computers 806. If so, the user directories are identified 807. The process software is transferred directly to the users' client computer directory 907. This can be done in several ways such as, but not limited to, sharing of the file system directories and then copying from the sender's file system to the recipient users' file system or alternatively using a transfer protocol such as File Transfer Protocol (FTP). The users access the directories on their client file systems in preparation for installing the process software 908. The users execute the program that installs the process software on their client computer 912, and then exit the process 808.

The process software is integrated into a client, server, and network environment by providing for the process software to coexist with applications, operating systems, and network operating systems software, and then installing the process software on the clients and servers in the environment where the process software will function.

The first step is to identify any software on the clients and servers including the network operating system where the process software will be deployed that are required by the process software or that work in conjunction with the process software. This includes the network operating system that is software that enhances a basic operating system by adding networking features.

Next, the software applications and version numbers will be identified and compared to the list of software applications and version numbers that have been tested to work with the process software. Those software applications that are missing or that do not match the correct version will be upgraded with the correct version numbers. Program instructions that pass parameters from the process software to the software applications will be checked to ensure the parameter lists match the parameter lists required by the process software. Conversely, parameters passed by the software applications to the process software will be checked to ensure the parameters match the parameters required by the process software. The client and server operating systems including the network operating systems will be identified and compared to the list of operating systems, version numbers, and network software that have been tested to work with the process software. Those operating systems, version numbers, and network software that do not match the list of tested operating systems and version numbers will be upgraded on the clients and servers to the required level.

After ensuring that the software, where the process software is to be deployed, is at the correct version level that has been tested to work with the process software, the integration is completed by installing the process software on the clients and servers.

Figure 11:
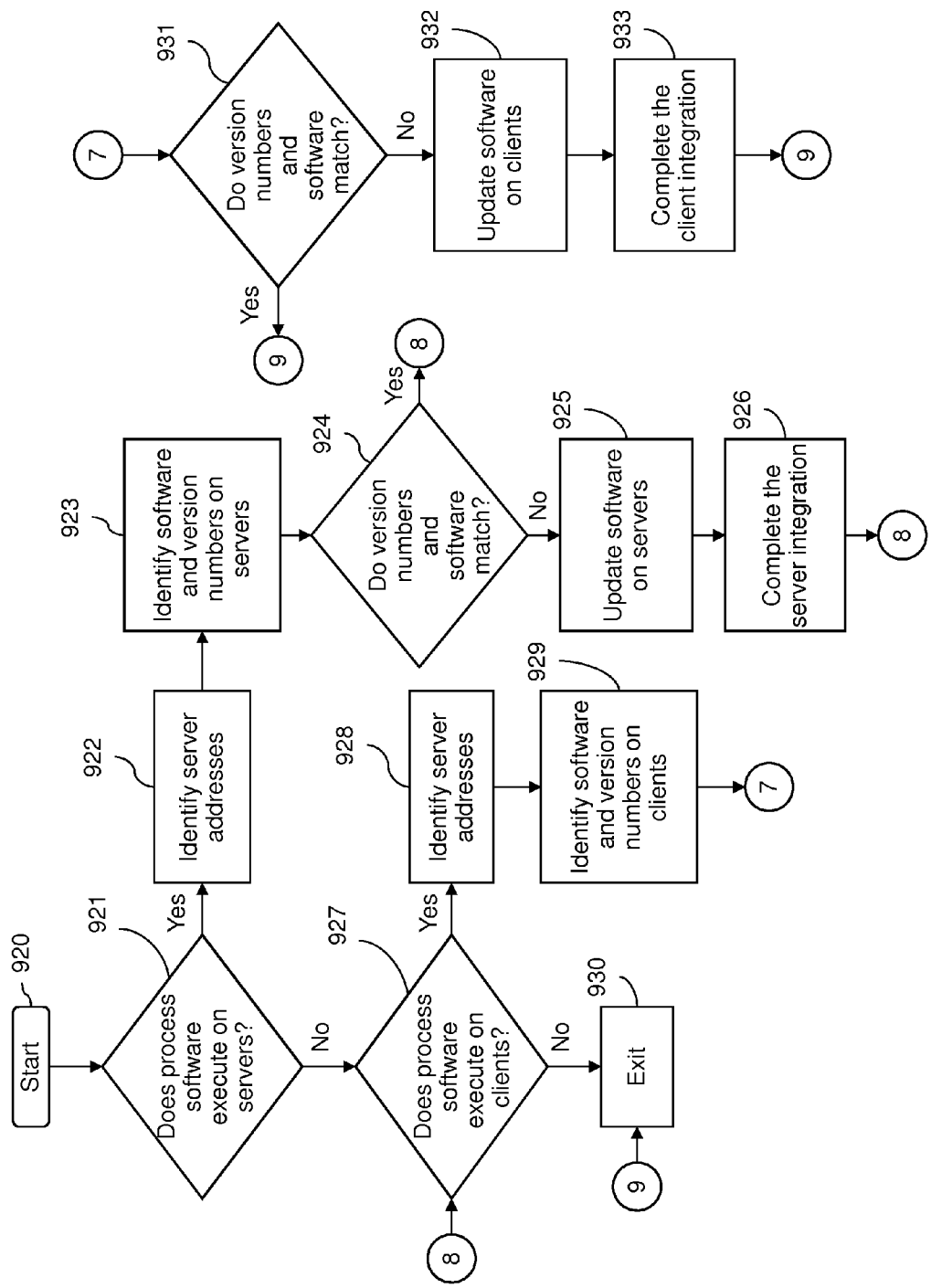
FIG. 11 is a schematic diagram of an integration system according to devices and methods herein.

In FIG. 11, step 920 begins the integration of the process software. The first thing is to determine if there are any process software programs that will execute on a server or servers 921. If this is not the case, then integration proceeds to 927. If this is the case, then the server addresses are identified 922. The servers are checked to see if they contain software that includes the operating system (OS), applications, and network operating systems (NOS), together with their version numbers that have been tested with the process software 923. The servers are also checked to determine if there is any missing software that is required by the process software 923.

A determination is made if the version numbers match the version numbers of OS, applications, and NOS that have been tested with the process software 924. If all of the versions match and there is no missing required software, the integration continues in 927.

If one or more of the version numbers do not match, then the unmatched versions are updated on the server or servers with the correct versions 925. Additionally, if there is missing required software, then it is updated on the server or servers 925. The server integration is completed by installing the process software 926.

Step 927, which follows either step 921, 924, or 926, determines if there are any programs of the process software that will execute on the clients. If no process software programs execute on the clients, the integration proceeds to 930 and exits. If this is not the case, then the client addresses are identified at 928.

The clients are checked to see if they contain software that includes the operating system (OS), applications, and network operating systems (NOS), together with their version numbers that have been tested with the process software 929. The clients are also checked to determine if there is any missing software that is required by the process software 929.

A determination is made as to whether the version numbers match the version numbers of OS, applications, and NOS that have been tested with the process software 931. If all of the versions match and there is no missing required software, then the integration proceeds to 930 and exits.

If one or more of the version numbers do not match, then the unmatched versions are updated on the clients with the correct versions 932. In addition, if there is missing required software then it is updated on the clients 932. Installing the process software on the clients 933 completes the client integration. The integration proceeds to 930 and exits.

The process software is shared, simultaneously serving multiple customers in a flexible, automated fashion. It is standardized, requiring little customization, and it is scalable, providing capacity On-Demand in a pay-as-you-go model.

The process software can be stored on a shared file system accessible from one or more servers. The process software is executed via transactions that contain data and server processing requests that use CPU units on the accessed server. CPU units are units of time such as minutes, seconds, and hours on the central processor of the server. Additionally, the assessed server may make requests of other servers that require CPU units. CPU units are an example that represents one measurement of use. Other measurements of use include, but are not limited to, network bandwidth, memory usage, storage usage, packet transfers, complete transactions etc.

When multiple customers use the same process software application, their transactions are differentiated by the parameters included in the transactions that identify the unique customer and the type of service for that customer. All of the CPU units and other measurements of use that are used for the services for each customer are recorded. When the number of transactions to any one server reaches a number that begins to affect the performance of that server, other servers are accessed to increase the capacity and to share the workload. Likewise, when other measurements of use such as network bandwidth, memory usage, storage usage, etc. approach a capacity so as to affect performance, additional network bandwidth, memory usage, storage etc. are added to share the workload.

The measurements of use used for each service and customer are sent to a collecting server that sums the measurements of use for each customer for each service that was processed anywhere in the network of servers that provide the shared execution of the process software. The summed measurements of use units are periodically multiplied by unit costs and the resulting total process software application service costs are alternatively sent to the customer and/or indicated on a web site accessed by the customer, which then remits payment to the service provider.

In another method, the service provider requests payment directly from a customer account at a banking or financial institution.

In another method, if the service provider is also a customer of the customer that uses the process software application, the payment owed to the service provider is reconciled to the payment owed by the service provider to minimize the transfer of payments.

Figure 12:
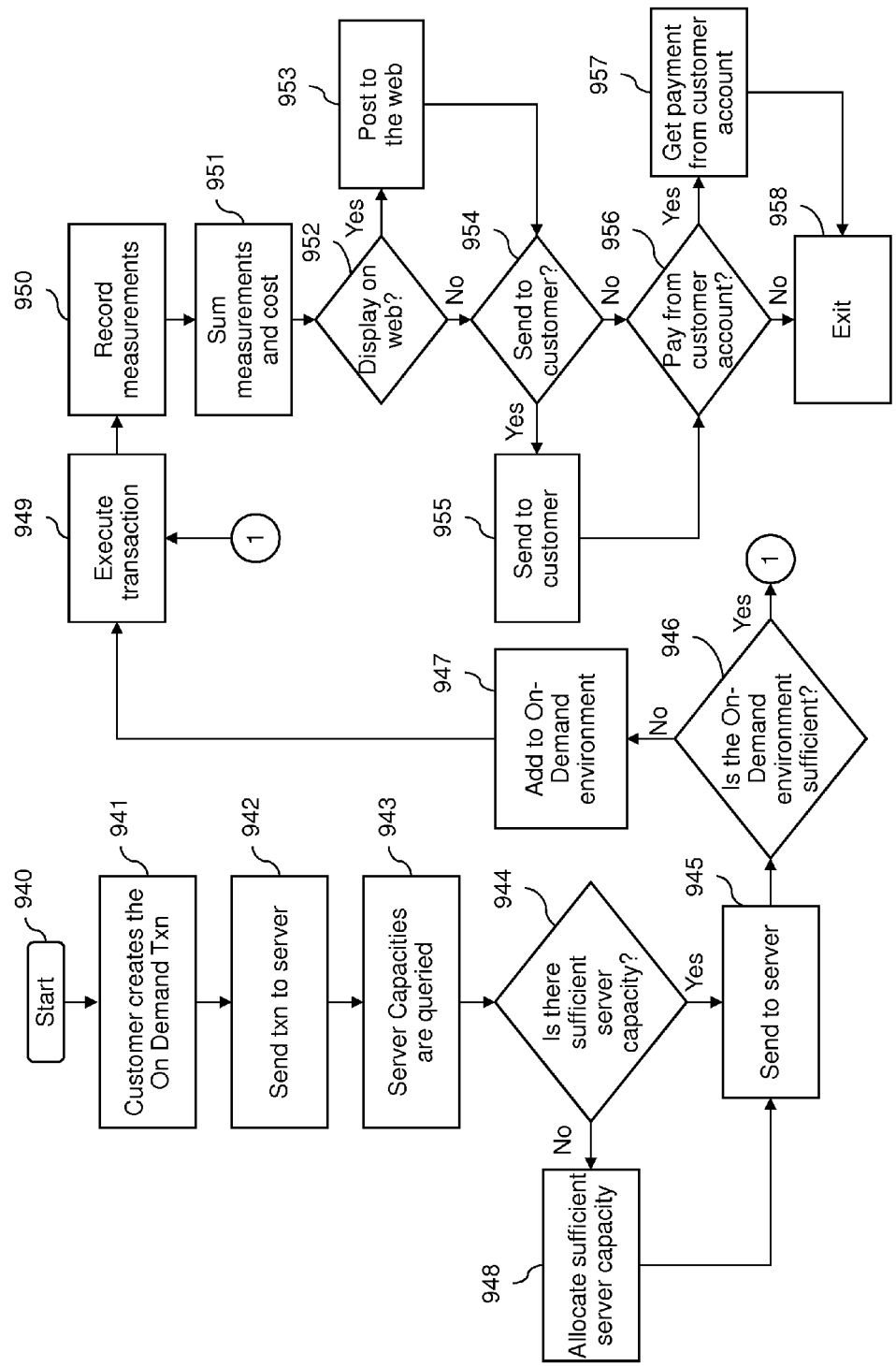
FIG. 12 is a schematic diagram of an On-Demand system according to devices and methods herein.

In FIG. 12, step 940 begins the On-Demand process. A transaction is created that contains the unique customer identification, the requested service type, and any service parameters that further specify the type of service 941. The transaction is then sent to the main server 942. In an On-Demand environment, the main server can initially be the only server, then, as capacity is consumed, other servers are added to the On-Demand environment.

The server central processing unit (CPU) capacities in the On-Demand environment are queried 943. The CPU requirement of the transaction is estimated, and then the servers' available CPU capacity in the On-Demand environment is compared to the transaction CPU requirement to see if there is sufficient CPU capacity available in any server to process the transaction 944. If there is not sufficient server CPU capacity available, then additional server CPU capacity is allocated to process the transaction 948. If there was already sufficient CPU capacity available, then the transaction is sent to a selected server 945.

Before executing the transaction, a check is made of the remaining On-Demand environment to determine if the environment has sufficient available capacity for processing the transaction. This environment capacity consists of such things as, but not limited to, network bandwidth, processor memory, storage etc. 946. If there is not sufficient available capacity, then capacity will be added to the On-Demand environment 947. Next, the required software to process the transaction is accessed, loaded into memory, and then the transaction is executed 949.

The usage measurements are recorded 950. The usage measurements consist of the portions of those functions in the On-Demand environment that are used to process the transaction. The usage of such functions as, but not limited to, network bandwidth, processor memory, storage, and CPU cycles are what are recorded. The usage measurements are summed, multiplied by unit costs, and then recorded as a charge to the requesting customer 951. If the customer has requested that the On-Demand costs be posted to a web site 952, then they are posted 953.

If the customer has requested that the On-Demand costs be sent via e-mail to a customer address 954, then they are sent 955. If the customer has requested that the On-Demand costs be paid directly from a customer account 956, then payment is received directly from the customer account 957. The last step is to exit the On-Demand process 958.

The process software may be deployed, accessed and executed through the use of a virtual private network (VPN), which is any combination of technologies that can be used to secure a connection through an otherwise unsecured or untrusted network. The use of VPNs is to improve security and for reduced operational costs. The VPN makes use of a public network, usually the Internet, to connect remote sites or users together. Instead of using a dedicated, real-world connection such as leased line, the VPN uses "virtual" connections routed through the Internet from the company's private network to the remote site or employee.

The process software may be deployed, accessed, and executed through either a remote-access or a site-to-site VPN. When using the remote-access VPNs, the process software is deployed, accessed, and executed via the secure, encrypted connections between a company's private network and remote users through a third-party service provider. The enterprise service provider (ESP) sets a network access server (NAS) and provides the remote users with desktop client software for their computers. The telecommuters can then dial a toll-free number or attach directly via a cable or DSL modem to reach the NAS and use their VPN client software to access the corporate network and to access, download, and execute the process software.

When using the site-to-site VPN, the process software is deployed, accessed, and executed through the use of dedicated equipment and large-scale encryption, which are used to connect a company's multiple fixed sites over a public network, such as the Internet.

The process software is transported over the VPN via tunneling, which is the process of placing an entire packet within another packet and sending it over a network. The protocol of the outer packet is understood by the network and both points, called tunnel interfaces, where the packet enters and exits the network.

Figure 13:
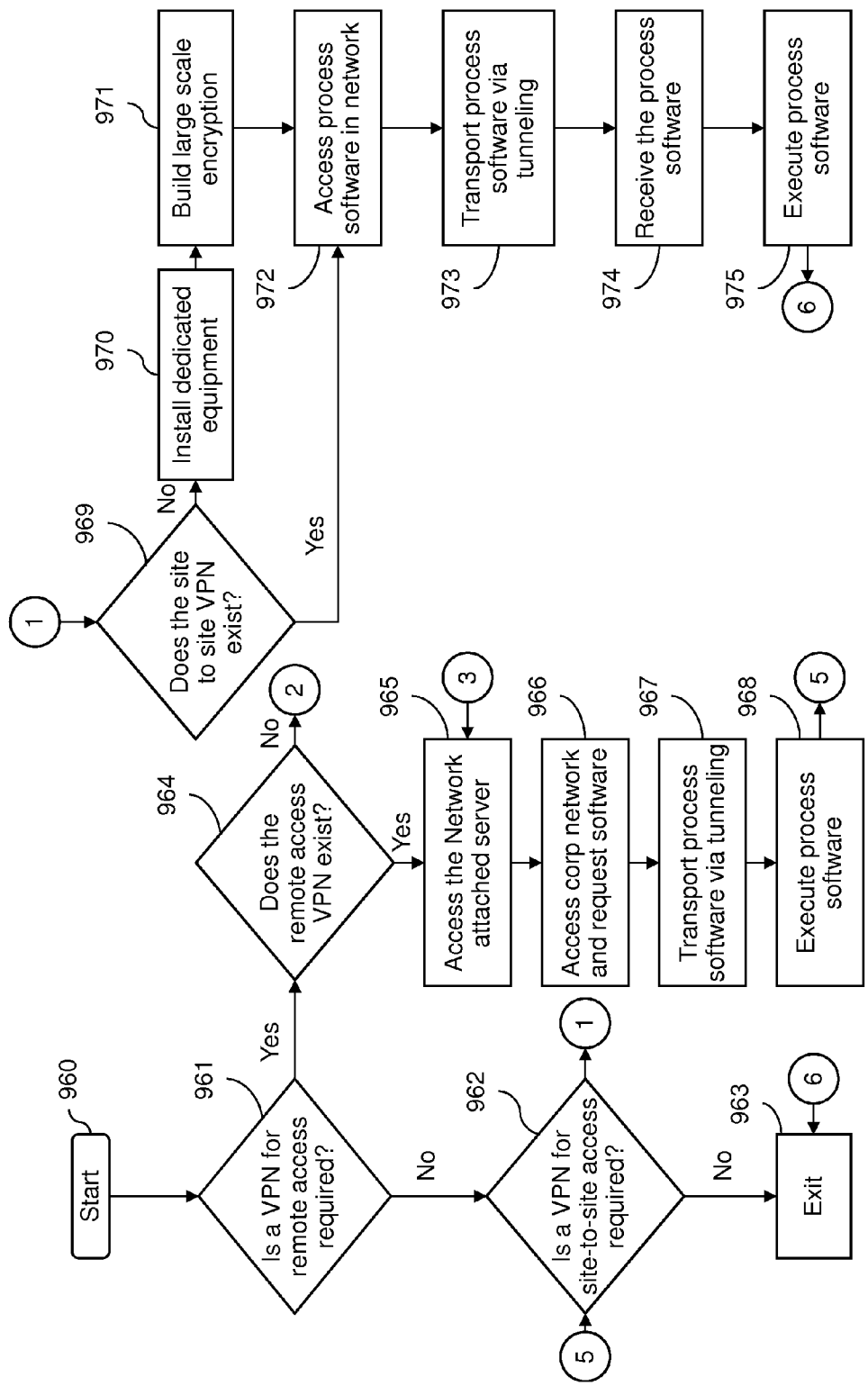
FIG. 13 is a schematic diagram of a virtual private network system according to devices and methods herein.
Figure 14:
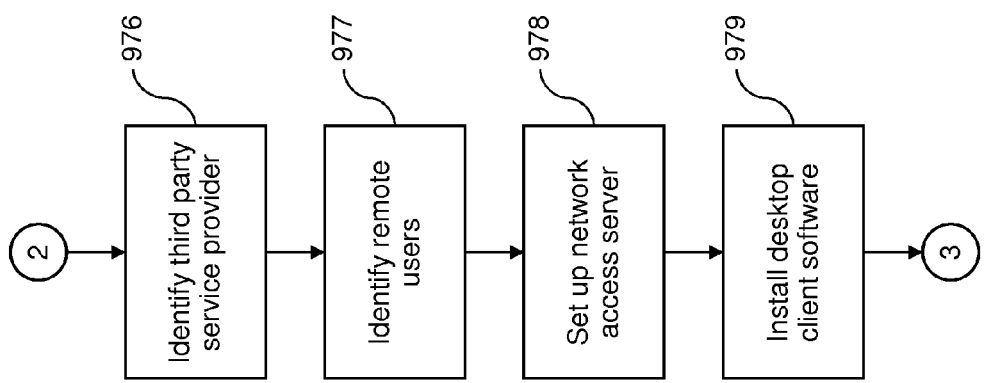
FIG. 14 is a schematic diagram of a virtual private network system according to devices and methods herein.

In FIGS. 13 and 14, step 960 begins the Virtual Private Network (VPN) process. A determination is made to see if a VPN for remote access is required 961. If it is not required, then proceed to 962. If it is required, then determine if the remote access VPN exists 964.

If it does exist, then proceed to 965. Otherwise, identify the third party provider that will provide the secure, encrypted connections between the company's private network and the company's remote users 976. The company's remote users are identified 977. The third party provider then sets up a network access server (NAS) 978 that allows the remote users to dial a toll-free number or attach directly via a cable or DSL modem to access, download, and install the desktop client software for the remote-access VPN 979.

After the remote access VPN has been built, or if it been previously installed, the remote users can then access the process software by dialing into the NAS or attaching directly via a cable or DSL modem into the NAS 965. This allows entry into the corporate network where the process software is accessed 966. The process software is transported to the remote users' desktop over the network via tunneling. That is, the process software is divided into packets and each packet, including the data and protocol, is placed within another packet 967. When the process software arrives at the remote users' desktop, it is removed from the packets, reconstituted, and executed on the remote users' desktop 968.

A determination is made to see if a VPN for site-to-site access is required 962. If it is not required, then proceed to exit the process 963. Otherwise, determine if the site-to-site VPN exists 969. If it does exist, then proceed to 972. Otherwise, install the dedicated equipment required to establish a site-to-site VPN 970. Then build the large-scale encryption into the VPN 971.

After the site-to-site VPN has been built, or if it had been previously established, the users access the process software via the VPN 972. The process software is transported to the site users over the network via tunneling 973. That is, the process software is divided into packets and each packet, including the data and protocol, is placed within another packet 974. When the process software arrives at the remote users' desktop, it is removed from the packets, reconstituted, and executed on the site users' desktop 975. Proceed to exit the process 963.

The terminology used herein is for the purpose of describing particular devices and methods only and is not intended to be limiting of this disclosure. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The corresponding structures, materials, acts, and equivalents of all means or step plus function elements in the claims below are intended to include any structure, material, or act for performing the function in combination with other claimed elements as specifically claimed. The descriptions of the various devices and methods herein have been presented for purposes of illustration, but are not intended to be exhaustive or limited to the devices and methods disclosed. Many modifications and variations will be apparent to those of ordinary skill in the art without departing from the scope and spirit of the described devices and methods. The terminology used herein was chosen to best explain the principles of the devices and methods, the practical application or technical improvement over technologies found in the marketplace, or to enable others of ordinary skill in the art to understand the devices and methods disclosed herein.

What is claimed is:

1. A structure, comprising:
    an active device in a silicon substrate;
    a dielectric film on said active device;
    an isolation trench extending through said dielectric film and at least partially into said silicon substrate, said trench surrounding said active device;
    a core in said isolation trench, said core comprising material having thermal conductivity greater than silicon dioxide and electrical conductivity equivalently comparable to silicon dioxide; and
    thermal isolation fins connected to said core in said isolation trench and at least partially surrounding said active device.

2. The structure according to claim 1, said active device comprising one of:
    a heterojunction bipolar transistor (HBT);
    a field effect transistor (FET); and
    Bipolar Complementary Metal Oxide Semiconductor (BiCMOS).

3. The structure of claim 1, further comprising:
    a liner comprising an insulator material on sidewalls of said isolation trench.

4. The structure according to claim 1, said material in said isolation trench comprising one of:
    aluminum nitride (AlN), and
    beryllium oxide (BeO).

5. The structure according to claim 4, said thermal isolation fins comprising the same material as said material in said isolation trench.

6. The structure according to claim 1, further comprising:
    a shallow trench isolation (STI) structure in said silicon substrate, said trench extending through said STI structure.

7. The structure according to claim 6, further comprising:
    a barrier layer between said dielectric film and said STI structure, said barrier layer comprising one of:
    nitride, and
    oxynitride.

* * * * *